US012699031B2

(12) United States Patent
Moretti et al.

(10) Patent No.: US 12,699,031 B2
(45) Date of Patent: Aug. 4, 2026

(54) WORK VEHICLE COMPONENT

(71) Applicant: ITALTRACTOR ITM S.p.A.,
Valsamoggia—Localita Crespellano (IT)

(72) Inventors: Nicolas Moretti, Verghereto (IT);
Eustachio Calia, Matera (IT)

(73) Assignee: ITALTRACTOR ITM S.P.A., Localitá
Crespellano (IT)

( * ) Notice: Subject to any disclaimer, the term of this
patent is extended or adjusted under 35
U.S.C. 154(b) by 229 days.

(21) Appl. No.: 17/756,574

(22) PCT Filed: Nov. 27, 2020

(86) PCT No.: PCT/IB2020/061213
§ 371 (c)(1),
(2) Date: May 27, 2022

(87) PCT Pub. No.: WO2021/105941
PCT Pub. Date: Jun. 3, 2021

(65) Prior Publication Data
US 2022/0412858 A1 Dec. 29, 2022

(30) Foreign Application Priority Data

Nov. 29, 2019 (IT) .......................... 102019000022563

(51) Int. Cl.
G01N 3/56 (2006.01)
B62D 55/32 (2006.01)
G01M 17/03 (2006.01)
H05K 1/189 (2026.01)

(52) U.S. Cl.
CPC .............. G01N 3/56 (2013.01); B62D 55/32
(2013.01); G01M 17/03 (2013.01); H05K
1/189 (2013.01)

(58) Field of Classification Search
CPC .......... G01N 3/56; B62D 55/32; G01M 17/03
See application file for complete search history.

(56) References Cited

U.S. PATENT DOCUMENTS 4,642,557 A * 2/1987 Ross ...................... G01N 17/00
324/71.2
6,352,123 B1 3/2002 Schlegel et al.
(Continued)

FOREIGN PATENT DOCUMENTS

CN 102365663 A * 2/2012 ............... G01B 7/18
CN 204479015 U 7/2015
(Continued)

OTHER PUBLICATIONS

Office Action issued in corresponding CN Application No.
202080082842.X dated Apr. 13, 2023.
(Continued)

*Primary Examiner* — Jill E Culler
(74) *Attorney, Agent, or Firm* — Husch Blackwell LLP

(57) ABSTRACT

The present invention describes a work vehicle component
comprising a cavity obtained in the component, having an
extension axis and delimited by a side wall, an opening for
the cavity placed at an outer surface of the component, a
wear sensor housed in the cavity and comprising a first axial
end placed at the opening for the cavity, a support body
inserted into the cavity with a first axial end aligned with the
first axial end of the wear sensor. The support body is
connected to the side wall of the cavity and constrained to
the side wall of the cavity, and the wear sensor is physically
connected to the support body and is constrained, at least in
an axial direction, to the support body.

17 Claims, 5 Drawing Sheets

(56)                    References Cited

U.S. PATENT DOCUMENTS

| | | | |
|---|---|---|---|
| 2005/0029018 A1 | 2/2005 | Kim | |
| 2005/0198967 A1* | 9/2005 | Subramanian | C23C 24/04 |
| | | | 60/803 |
| 2006/0151261 A1 | 7/2006 | Wagner et al. | |
| 2008/0179946 A1 | 7/2008 | Oertley | |
| 2015/0066291 A1* | 3/2015 | Johannsen | B62D 55/32 |
| | | | 701/34.4 |
| 2015/0081166 A1 | 3/2015 | Diekevers et al. | |
| 2016/0121945 A1 | 5/2016 | Rust et al. | |
| 2016/0178483 A1* | 6/2016 | Sidles | E02F 9/2883 |
| | | | 73/146 |
| 2016/0319520 A1 | 11/2016 | Marchand | |
| 2017/0002308 A1 | 1/2017 | Liu | |
| 2017/0261450 A1 | 9/2017 | Baarman et al. | |
| 2019/0106165 A1 | 4/2019 | Bradley et al. | |

FOREIGN PATENT DOCUMENTS

| | | | |
|---|---|---|---|
| CN | 105735403 A | 7/2016 | |
| CN | 106536335 A | 3/2017 | |
| CN | 106536692 A | 3/2017 | |
| CN | 106963411 A | 7/2017 | |
| CN | 107074336 A | 8/2017 | |
| CN | 107849836 A | 3/2018 | |
| CN | 108168417 A | 6/2018 | |
| EP | 2637014 A1 | 9/2013 | |
| EP | 3279064 A1 | 2/2018 | |
| JP | H02-176270 A | 7/1990 | |
| JP | H08-29109 A | 2/1996 | |
| KR | 2011050810 A * | 5/2011 | |
| KR | 20160116954 A | 10/2016 | |
| WO | 2016069535 A1 | 5/2016 | |
| WO | 2019097556 A1 | 5/2019 | |

OTHER PUBLICATIONS

Notification of Paying Granting Fee dated Sep. 24, 2023 corresponding Chinese application 2020800820842.X.

Machine Translation of CN106963411A.

Japanese Office Action dated Sep. 25, 2024 for Japanese Patent Application No. 2022-531360.

* cited by examiner

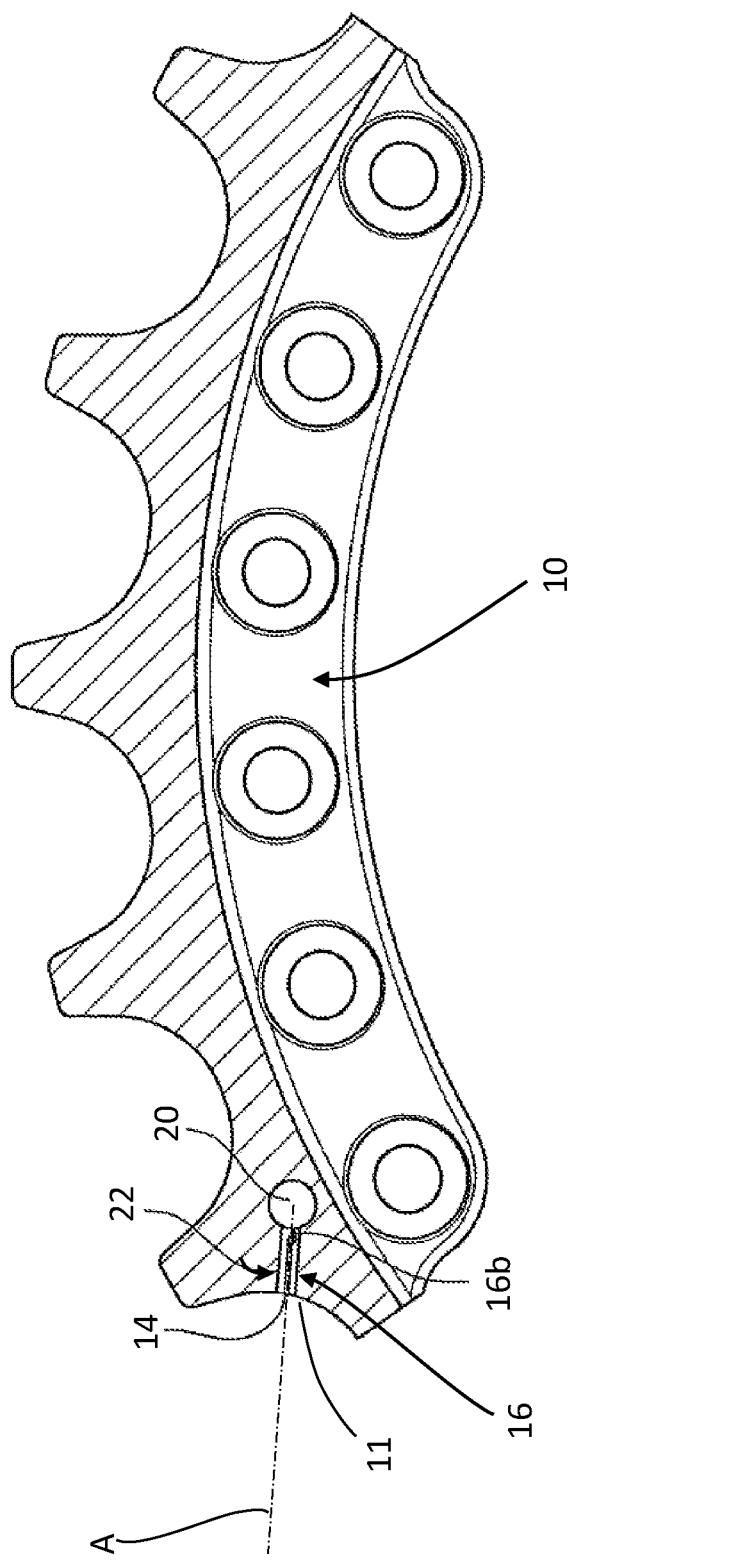
_Fig 7_

WORK VEHICLE COMPONENT

CROSS REFERENCES

This application is a U.S. National Phase Application of International Application No. PCT/IB2020/061213 filed on Nov. 27, 2020, which in turn claims priority to Italian Application No. 102019000022563 filed on Nov. 29, 2019, the disclosures of which are incorporated herein by reference in their entireties.

TECHNICAL FIELD

The present invention relates to a component of a work vehicle such as an earth moving machine, a mining machine, a demolition machine and the like.

BACKGROUND

Such types of machines are usually installed on movement structures known as undercarriages to allow the machine to be able to be moved on ground that is often uneven or loose.

An undercarriage typically comprises two chain assemblies distanced from one another and arranged parallel, configured to receive a torque and transfer it to the ground.

Each chain assembly comprises a plurality of undercarriage components that usually comprise a closed loop chain on a drive wheel and an idler wheel operatively connected to a tensioning unit. The undercarriage components further comprise, between the drive wheel and the idler wheel, a plurality of rollers configured to guide the chain during its motion and to absorb the loads transmitted by the machine.

The chain usually comprises a plurality of links each usually comprising a pair of plates facing one another. The links are usually interconnected by pins and bushes. Each pin is usually inserted into holes provided on the plates and connects two links to one another. The bushes are usually placed radially to the outside of the pins for distancing the plates of the links from one another, protecting the pins from the external environment and for meshing the drive wheel and the idler wheel. On the links the shoes are usually mounted which, being in direct contact with the ground, have the task of discharging the traction onto the ground and increasing the contact surface between the machine and the ground. The type of shoe used depends on the ground on which the machine is to operate, the environmental conditions in which the machine is to operate, and the specifications suggested by the machine manufacturer.

The undercarriage is usually subjected to very demanding operating conditions, both due to the total weight of the machine, and the high power transferred by the machine engine to the ground, and the conformation and composition of the ground on which the machine is to operate.

The undercarriage components, like other components of the work machine such as the bucket, the ripper, the loader, the bucket teeth, the loader teeth and the ripper teeth, are therefore subjected to high mechanical stress that can cause damage and wear to the components themselves.

Wear is one of the reasons for machine downtime for performing repair interventions or replacement of components of the work machine to guarantee the correct operation thereof.

The Applicant has verified that the correct planning of machine downtime enables the performance of the machine, in terms of production, to be optimized. In particular, the Applicant has verified that to optimize the production performance of the work machine, the latter should be stopped and subjected to repair interventions or replacement of components before wear phenomena cause the machine to break down and therefore a forced and sudden stop. The Applicant has also verified that, at the same time, the optimization of the production performance of the work machine cannot anticipate machine downtime for the repair or replacement of components that are not effectively compromised or close to effective breakdown, as the total machine downtimes would be unjustifiably long.

The Applicant has noted that in order to be able to predict breakdowns due to excessive wear of one or more components of the work machine and prevent having to replace or repair components that still work correctly, it would be important to be able to know the current wear condition of the components or however of the components most subject to wear.

The Applicant has hypothesized that it may be possible to predict the state of wear of a work machine component by making use of statistical considerations on the rate of wear of the component knowing, for each type of machine and component and for each type of working condition of the machine, the mean operating life (in terms of operating hours of the machine) of each component.

The Applicant has however verified that such statistical considerations are not reliable as there are too many, often interconnected, variables to consider in order to be able to obtain significant data and able to effectively estimate the state of wear of each component.

The Applicant has therefore perceived that it is appropriate to be able to have a direct measurement of the state of wear of one or more components of the work machine in order to be able to effectively predict breakdowns and, at the same time, reduce to a minimum the number of machine downtimes necessary to guarantee the correct operation of the machine.

For that purpose, the Applicant has tried to perform periodic inspections on the state of wear of the components through a visual or instrumental check on the components by qualified personnel.

The Applicant has verified that, for obvious safety reasons, such periodic inspections require an interruption to the operation of the machine with consequent, although limited, machine downtime necessary for performing the inspections.

Furthermore, in accordance with the Applicant's experience, it is not always possible to perform a visual or instrumental check on the components, e.g. undercarriage components, as such components may not be directly reachable (such as, for example, in the case of pins or elements inside the rollers) or they may be covered in mud, dirt and the like (very often present in typical environments where the machines operate).

Document US 2015/0081166 describes a system for monitoring the wear on undercarriage components that comprises a sensor device having a probe configured to measure wear-related information. The probe may be a resistance with one or more resistors configured so that as the probe gets worn a resistance value associated with the probe changes. The change in resistance value is connected with the amount of material that has been removed due to wear from the undercarriage component. The probe is placed in proximity to or in contact with the undercarriage component.

Document WO2019/097556 in the name of the Applicant teaches the provision of a seat on an undercarriage component wherein the seat is open towards the outside and is configured to receive a consumable transducer. The transducer envisages the presence of an electric circuit supported by a substrate and comprising a plurality of discrete elements that are coupled in parallel. The transducer is arranged with an end thereof aligned with the outer surface of the undercarriage component, so that the transducer is subjected to the same wear as the undercarriage component.

The Applicant believes that systems such as those described in US 2015/0081166 and WO2019/097556 can provide indications on the current state of wear of an undercarriage component.

However, the Applicant has found that to have effective indications on the state of wear of a work machine component it is necessary to guarantee that the wear sensor is always substantially aligned with the surface of the component of which the state of wear is to be monitored.

The Applicant has therefore perceived that it would be advantageous to be able to guarantee a constant substantial alignment between the wear sensor and the surface of the work machine component of which the state of wear is to be monitored.

SUMMARY

The present invention therefore relates to a work machine component comprising: a cavity obtained in the component, having an extension axis and delimited radially by at least one side wall; an opening for the cavity placed at an outer surface of the component;

a wear sensor housed in the cavity and comprising a first axial end placed at the opening for the cavity;

a support body inserted in the cavity with a first axial end aligned with the first axial end of the wear sensor, wherein the support body is physically connected to the side wall of the cavity and constrained, at least in an axial direction, to the side wall of the cavity, and wherein the wear sensor is physically connected to the support body and is constrained, at least in an axial direction, to the support body.

The first axial end of the wear sensor, being placed at the opening for the cavity which is placed on the outer surface of the component, is in contact with the work surface on which the component operates (such work surface being for example the ground or another component). In this way, the wear of the component, which causes the removal of material from the outer surface of the component and therefore a lowering in the axial direction of such outer surface, can be identified by the wear sensor.

The Applicant has verified that the forces exerted by the work surface on the wear sensor (which is in contact with the work surface) could damage the wear sensor.

The Applicant has perceived that by providing a support body which has a first axial end aligned with the axial end of the wear sensor, the forces that the work surface transmits to the wear sensor and that could damage the wear sensor are intercepted (at least in part) by the support body. This enables any possible breaking of the wear sensor to be anticipated. By physically connecting the support body to the side wall of the cavity, it is possible both to prevent the support body being able to move with respect to the cavity and to enable the forces exerted by the work surface on the support body to be at least partially transferred from the support body to the component. By physically connecting the wear sensor to the support body and constraining in the axial direction the wear sensor to the support body, it is therefore possible to keep the wear sensor in a predetermined position inside the cavity, in particular it is possible to keep the first axial end of the wear sensor at the opening for the cavity and therefore at the outer surface of the component.

This makes it possible to guarantee that the wear sensor is always substantially aligned with the outer surface of the component and therefore to reliably identify the current degree of wear of the component.

The term "work machine component" or "component" means a component of the work machine that is subject to loads, stress and strain that can cause wear on the component itself. Examples of work machine components are the bucket, the ripper, the loader, the teeth of the bucket, of the loader and of the ripper, an undercarriage component.

The term "undercarriage component" means any component from among a drive wheel, an idler wheel, a pin, a bush, a link, a link plate, a roller, a shoe, of an undercarriage.

The cavity in the component has an extension axis along which the cavity is formed. Such extension axis can coincide with an axis of symmetry of the cavity in the event in which the cavity is substantially cylinder shaped.

The terms "axial", "axially", "radial" and "radially" are used with reference to a component of which the state of wear is to be monitored.

In particular, the terms "axial" and "axially" are meant as references/sizes arranged/measured or extending in a substantially parallel direction to the extension axis of the cavity in the component.

The terms "radial" and "radially" mean references/sizes arranged/measured or extending in a substantially perpendicular direction to the extension axis of the cavity in the component and lying in a perpendicular plane to such extension axis.

The terms "radially internal/external" mean respectively a position closer to or further away from the aforesaid extension axis of the cavity.

The terms "axially internal/external" mean respectively a position closer to or further away from the opening for the cavity in the component.

The term "sensor" means a device that is in direct interaction with the measured system, i.e. the first element of a measurement chain that converts the process variable into a measurable signal.

The term "wear" means the gradual loss of material from the surface of a body. When it refers to a component, it means the gradual loss of material from a surface of the component.

The expression "mechanical properties" when it refers to a body or to a structure means at least one from among the mechanical resistance (defined as the capacity to withstand static stress), resilience (defined as the capacity to withstand dynamic stress), the hardness (defined as resistance to localized plastic deformations), fatigue resistance (defined as the capacity to withstand periodic stress).

The present invention can comprise at least one of the preferred characteristics described below.

Preferably, the wear sensor is constrained to the support body also in the radial direction.

Preferably, the wear sensor comprises one substrate and at least one electric circuit supported by the substrate, wherein the wear sensor comprises a measurement portion that can be worn down and configured to modify measurable electrical properties of the at least one electric circuit according to the degree of wear.

In this way, the axial end of the wear sensor placed at the opening for the cavity gradually loses material as the component gets worn. This is due to the fact that the wear on the component causes a lowering in the radial direction of the outer surface of the component and a consequent lowering in the radial direction of the cavity opening. The lowering of the cavity opening tends to make the measurement portion of the wear sensor emerge, which is also subject to wear. The support body is also subject to wear and loses material as the cavity opening is lowered in the radial direction.

The gradual loss of material from the wear sensor changes measurable electrical properties of the electric circuit enabling, from the reading of such electrical properties, the quantity of material lost from the sensor to be determined.

The measurable electrical properties of the electric circuit may for example be the electrical resistance, the electrical capacity or the inductance considered individually or in combination.

The substrate has the function of interconnecting the various electrical components of the electric circuit to each other, e.g. through conductive tracks engraved or marked on the substrate itself.

Preferably, the mechanical properties of the support body are different from the mechanical properties of the substrate of the wear sensor.

Preferably, the wear sensor is a flexible printed circuit (FPC).

A flexible printed circuit is, according to the definition provided by the Association Connecting Electronics Industries (IPC (1996) IPC-T-50: Terms and Definitions for Interconnecting and Packaging Electronic Circuits, Revision F (June 1996), IPC, Northbrook, IL), an arrangement according to a diagram of a printed circuit and components that uses a flexible base material with or without a flexible covering layer.

The flexible base material creates the substrate of the wear sensor.

The Applicant has found that by using a flexible printed circuit for making the wear sensor, any forces transferred from the work surface to the wear sensor would be immediately compensated by deformations of the printed circuit. This makes it possible both to prevent breaks to the wear sensor and to prevent axial displacements of the entire wear sensor.

In fact, the Applicant has perceived that by using a flexible printed circuit for making the wear sensor, the wear sensor bends (at the first axial end) when subjected to a force transmitted by the work surface until such force is cancelled out. During bending the wear sensor does not lose contact with the work surface thus continuing to perform its function. Furthermore, the bending of the first end of the wear sensor prevents the force transmitted by the work surface tending to axially displace the wear sensor with respect to the support body.

Examples of materials that can be used for making the substrate are polyimides, polyethylene naphthalate, polyethylene terephtalate, polyethylene, polyurethane, polyester, fluoropolymers.

Preferably, the substrate is in film form.

Preferably, the material of which the substrate of the wear sensor is made is different from the material of which the support body is made.

Preferably, the support body extends in the axial direction for a length at least equal to the length in the axial direction of the measurement portion of the wear sensor.

In this way, the support body is able to perform its function on the wear sensor for at least the entire portion of the sensor configured to get worn.

Preferably, the substrate and the at least one electric circuit of the wear sensor are not in direct contact with the side wall of the cavity.

In this way, any strain that the component transfers to the side wall of the cavity is not directly transmitted to the wear sensor.

Preferably, the support body has a section, obtained along a predetermined radial plane, having an area greater than or equal to about 30% of the cross-section area of the cavity on a section obtained along the same predetermined radial plane.

Preferably, the support body has a section, obtained along a predetermined radial plane, having an area greater than or equal to about 50% of the cross-section area of the cavity on a section obtained along the same predetermined radial plane.

Preferably, the support body has a section, obtained along a predetermined radial plane, having an area greater than or equal to about 75% of the cross-section area of the cavity on a section obtained along the same predetermined radial plane.

Preferably, the support body has a section, obtained along a predetermined radial plane, having an area greater than or equal to about 90% of the cross-section area of the cavity on a section obtained along the same predetermined radial plane.

Preferably, between the side wall of the cavity and the wear sensor at least one portion of the support body is interposed.

In this way, any strain that the component transfers to the side wall of the cavity is transmitted to the support body and not to the wear sensor.

Preferably, along the entire axial extension of the wear sensor, between the side wall of the cavity and the wear sensor at least one portion of the support body is interposed.

Preferably, the ratio between the resistance to localized plastic deformation of the material that constitutes the support body and the resistance to localized plastic deformation of the material of the component surrounding the cavity is greater than or equal to 0.15, where the resistance to localized plastic deformation of the support body and of the component are measured with a Brinell scale with identical test conditions; or the ultimate tensile strength of the material that constitutes the support body is greater than or equal to 15% of the ultimate tensile strength of the component surrounding the cavity.

An example of test conditions that can be used for measuring the hardness according to the Brinell scale can be found in standard ISO 6506-1:2015.

The resistance to concentrated plastic deformations of the material is the hardness of the material.

Should the hardness of the support body (or of the component) not be measurable with a Brinell scale using identical test conditions for measuring the hardness of the component (or of the support body), or in the event that it is not possible to accurately determine the hardness of the support body or of the component using a Brinell scale, it is preferable to refer to the ratio between the ultimate tensile strength of the material that constitutes the support body and the ultimate tensile strength of the material that constitutes the component for comparing the two hardnesses.

The ultimate tensile strength for metallic materials is preferably determined according to standard ISO 6892-1: 2016. The ultimate tensile strength for plastic or polymer materials is preferably determined according to standard ISO 527-1:2019.

The Applicant has verified that the edges of the opening of the cavity in the component can tend to be deformed plastically in the radial direction towards the axis of the cavity, presumably due to the forces transmitted between the component and the work surface. Such deformation tends to close the cavity opening, especially when the component has already suffered a certain degree of wear. The closure, or partial closure, of the cavity opening can prevent the wear sensor from performing its function of losing material as the component gets worn.

The Applicant has found that the provision of a support body within the cavity, in which the ratio between the hardness of the material that constitutes the support body and the hardness of the material of the component surrounding the cavity is comprised in the interval specified above, is able to contrast the aforementioned deformation of the edges of the cavity opening.

In particular, the Applicant has found that an increase in the hardness of the support body reduces the plastic deformation in the radial direction of the edge of the opening.

However, the Applicant has found that it would be appropriate not to exceed a predetermined ratio between the hardness of the support body and the hardness of the component. In fact, the Applicant has found that too high hardness of the support body with respect to the hardness of the component could expose the support body axially (subject to less wear with respect to the outer surface of the component) beyond the external surface of the component. This would expose the support body to loads that are too high and which would cause the breaking thereof.

Preferably, the ratio between the resistance to localized plastic deformation of the material that constitutes the support body and the resistance to localized plastic deformation of the material of the component surrounding the cavity is greater than or equal to 0.30, where the resistance to localized plastic deformation of the support body and of the component are measured with a Brinell scale with identical test conditions; or the ultimate tensile strength of the material that constitutes the support body is greater than or equal to 30% of the ultimate tensile strength of the component surrounding the cavity.

Preferably, the ratio between the resistance to localized plastic deformation of the material that constitutes the support body and the resistance to localized plastic deformation of the material of the component surrounding the cavity is less than or equal to 1.5, where the resistance to localized plastic deformation of the support body and of the component are measured with a Brinell scale with identical test conditions; or the ultimate tensile strength of the material that constitutes the support body is greater than or equal to 150% of the ultimate tensile strength of the component surrounding the cavity.

Preferably, the ratio between the resistance to localized plastic deformation of the material that constitutes the support body and the resistance to localized plastic deformation of the material of the component surrounding the cavity is greater than or equal to 0.50, where the resistance to localized plastic deformation of the support body and of the component are measured with a Brinell scale with identical test conditions; or the ultimate tensile strength of the material that constitutes the support body is greater than or equal to 50% of the ultimate tensile strength of the component surrounding the cavity.

Preferably, the ratio between the resistance to localized plastic deformation of the material that constitutes the support body and the resistance to localized plastic deformation of the material of the component surrounding the cavity is less than or equal to 1.30, where the resistance to localized plastic deformation of the support body and of the component are measured with a Brinell scale with identical test conditions; or the ultimate tensile strength of the material that constitutes the support body is greater than or equal to 130% of the ultimate tensile strength of the component surrounding the cavity.

Preferably, the ratio between the resistance to localized plastic deformation of the material that constitutes the support body and the resistance to localized plastic deformation of the material of the component surrounding the cavity is greater than or equal to 0.75, where the resistance to localized plastic deformation of the support body and of the component are measured with a Brinell scale with identical test conditions; or the ultimate tensile strength of the material that constitutes the support body is greater than or equal to 75% of the ultimate tensile strength of the component surrounding the cavity.

Preferably, the ratio between the resistance to localized plastic deformation of the material that constitutes the support body and the resistance to localized plastic deformation of the material of the component surrounding the cavity is less than or equal to 1.10, where the resistance to localized plastic deformation of the support body and of the component are measured with a Brinell scale with identical test conditions; or the ultimate tensile strength of the material that constitutes the support body is greater than or equal to 110% of the ultimate tensile strength of the component surrounding the cavity.

Preferably, the ratio between the resistance to localized plastic deformation of the material that constitutes the support body and the resistance to localized plastic deformation of the material of the component surrounding the cavity is greater than or equal to 0.90, where the resistance to localized plastic deformation of the support body and of the component are measured with a Brinell scale with identical test conditions; or the ultimate tensile strength of the material that constitutes the support body is greater than or equal to 90% of the ultimate tensile strength of the component surrounding the cavity.

Preferably, the ratio between the resistance to localized plastic deformation of the material that constitutes the support body and the resistance to localized plastic deformation of the material of the component surrounding the cavity is equal to 1, where the resistance to localized plastic deformation of the support body and of the component are measured with a Brinell scale with identical test conditions; or the ultimate tensile strength of the material that constitutes the support body is greater than or equal to 100% of the ultimate tensile strength of the component surrounding the cavity.

Preferably, the support body is made of metal. Examples of metals that can be used for making the support body are steel, stainless steel, bronze, brass, cast iron, aluminium alloys. In this way, the ratio between the hardness of the material that constitutes the support body and the hardness of the material of the component surrounding the cavity is within the intervals specified above.

Preferably, the support body and the component are made of the same material.

In some embodiments of the invention, the support body can be made of polymer material, such as for example aliphatic polyamides (such as nylon and ertalon) and aromatic polyamides (such as kevlar).

The Applicant has found that, although a support body made of polymer material is less effective than one made of metallic material in order to prevent the plastic deformation of the edges of the cavity opening, a support body made of polymer material transfers less vibrational strain to the wear sensor.

In fact, the Applicant has found that during normal use of the component, the support body is subjected to dynamic loads (as well as static loads) that can generate undesired vibrations in the support body.

By providing the support body made of polymer material, such vibrations can be dampened and not directly transmitted to the wear sensor. In this way, the wear sensor is less strained and therefore less subject to possible breaks.

The Applicant has also found that, regardless of the material of which the support body is made, as the degree of filling of the cavity by the support body increases, the plastic deformation of the opening edge in the radial direction decreases.

Preferably, the volume of the support body is equal to at least 15% of the volume of the cavity.

Preferably, the volume of the support body is equal to at least 30% of the volume of the cavity.

Preferably, the volume of the support body is equal to at least 50% of the volume of the cavity.

Preferably, the volume of the support body is equal to at least 75% of the volume of the cavity.

Preferably, the volume of the support body is equal to at least 90% of the volume of the cavity.

Preferably, the volume of the support body is equal to at least 95% of the volume of the cavity.

Preferably, the support body is constrained to the side wall of the cavity through the use of adhesives. An example of glue that can be used is a two-component epoxy thixotropic glue that is resistant to heat and to chemical agents such as, for example, the product Elantas ADH 50.50.

In this case, the support body is preferably inserted with radial clearance within the cavity.

Preferably, the extent of the radial clearance between the support body and the cavity is less than 2 millimetres.

Preferably, the extent of the radial clearance between the support body and the cavity is less than 1.5 millimetres.

Preferably, the extent of the radial clearance between the support body and the cavity is less than 1.0 millimetres.

Preferably, the extent of the radial clearance between the support body and the cavity is less than 0.5 millimetres.

Radial clearance between the support body and the cavity means the displacement in the radial direction of the support body between two radially opposite positions in which each position of the support body is in contact with the side wall of the cavity.

Alternatively, the support body is inserted with mechanical interference into the cavity. In other words, along at least one radial plane, the maximum dimension in the radial direction of the support body is preferably greater than the minimum dimension in the radial direction of the cavity. The coupling by mechanical interference of the support body in the cavity prevents any relative movement between the support body and the cavity.

Preferably, the support body comprises a housing seat for the wear sensor; the wear sensor being constrained to the housing seat.

In this way, particularly when the support body is inserted by mechanical interference into the cavity, the wear sensor is not damaged during the positioning of the support body within the cavity.

Preferably, the wear sensor is embedded into the support body.

In this way, the support body may be inserted by casting into the cavity having previously positioned the wear sensor inside the cavity.

In some embodiments, the support body is made of electrically insulating material.

BRIEF DESCRIPTION OF THE DRAWINGS

Further characteristics and advantages of the invention will be more evident from the following description of a preferred embodiment thereof, made with reference to the appended drawings. In such drawings:

FIGS. 6 and 7 are partially sectional views of components according to the present invention.

DETAILED DESCRIPTION

Figure 1:
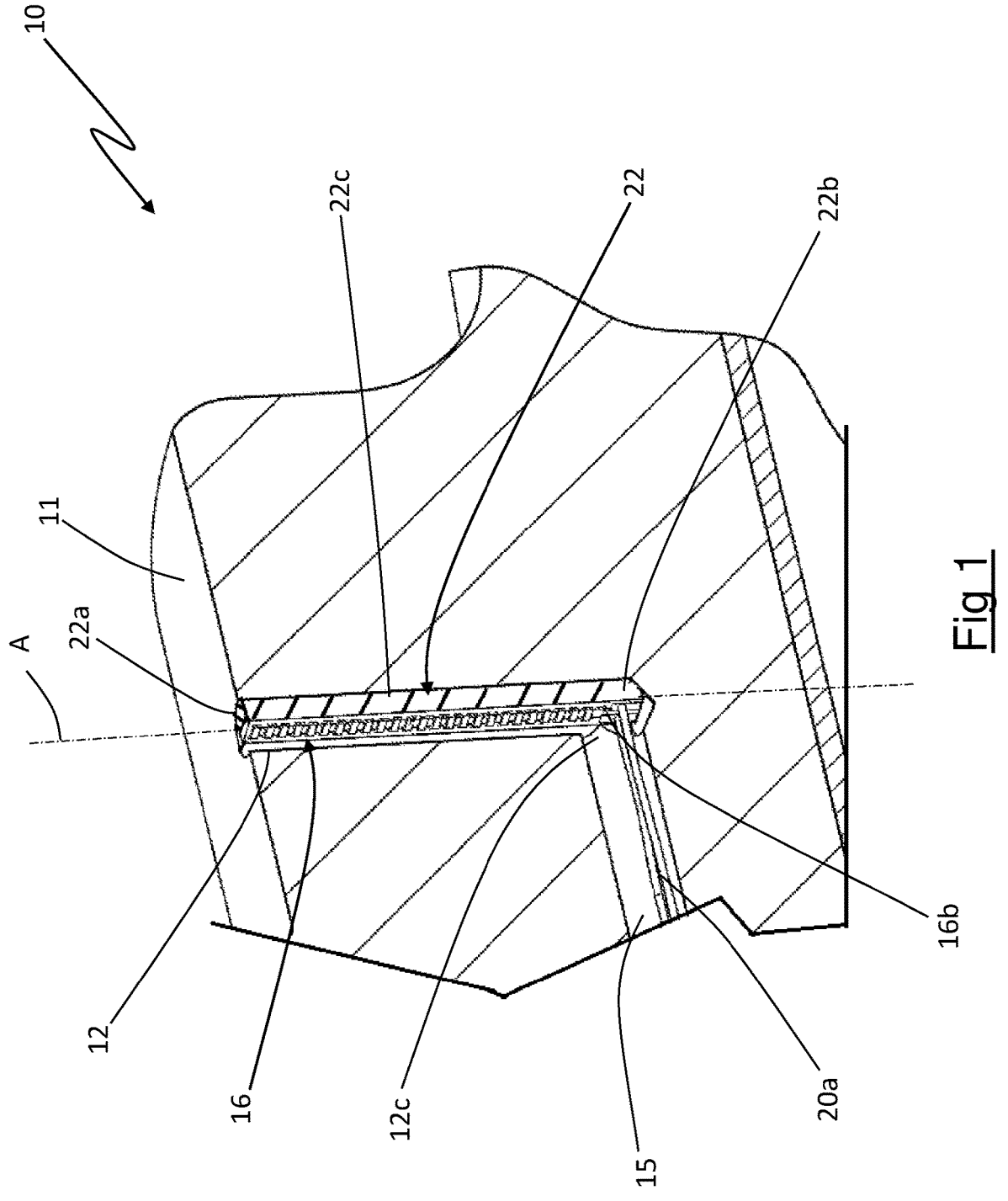
FIG. 1 is a schematic, perspective and sectional view of a part of a component of a work machine according to the present invention.

With reference to FIG. 1, 10 indicates overall a component according to the present invention.

The work machine component 10 illustrated in the appended figures is an undercarriage component and reference will be made thereto below as an example of a work machine component. The undercarriage component 10 can for example be a drive wheel or an idler wheel or a pin or a bush or a link or a link plate or a roller or a shoe of an undercarriage.

Figure 6:
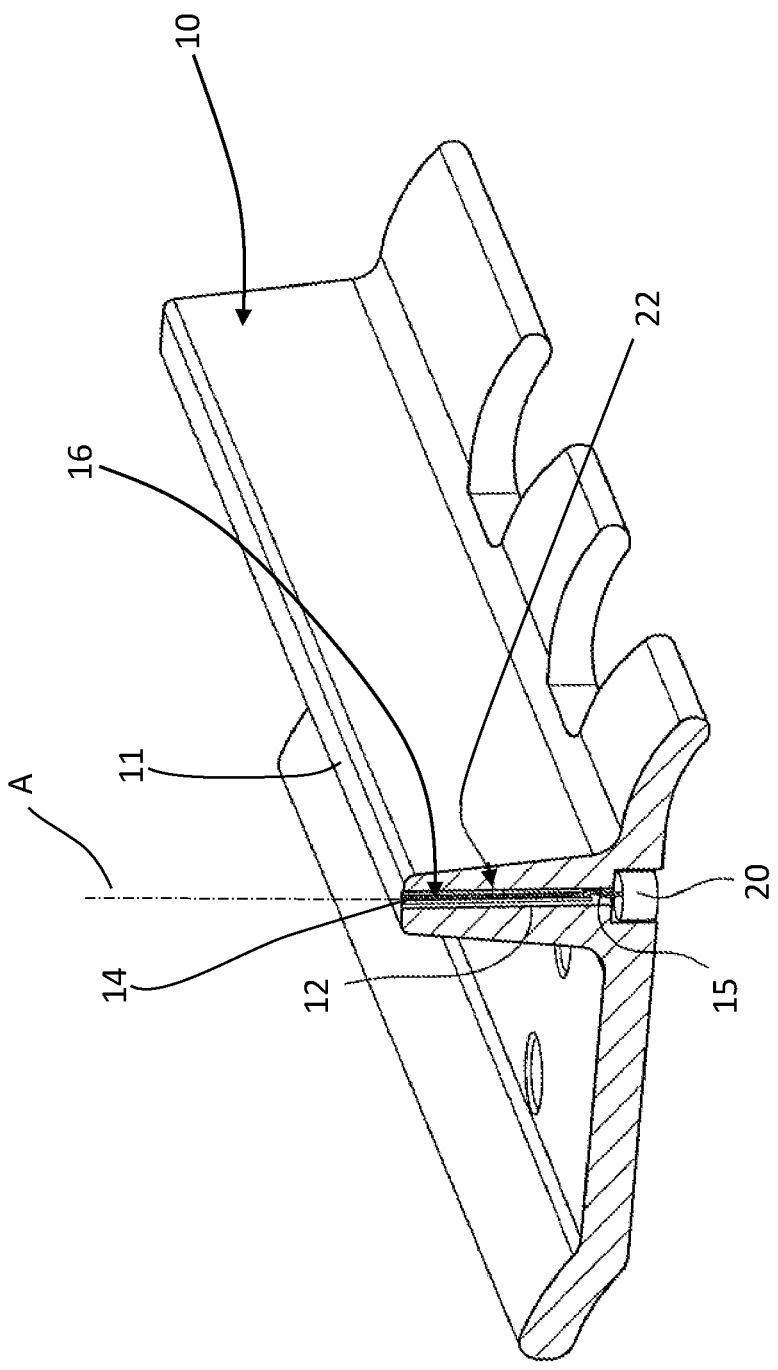

FIG. 6 illustrates an example in which the undercarriage component 10 is a shoe, whereas FIG. 7 shows an example in which the undercarriage component 10 is a drive wheel.

As shown in FIG. 1, the undercarriage component 10 comprises an outer surface 11 which is intended to interact with a work surface (not illustrated) which can for example be the outer surface of another undercarriage component or the ground.

In the example of FIG. 6 the work surface is the ground on which the caterpillar moves whereas in the example of FIG. 7 the work surface is another undercarriage component, in particular the bushes of the chain.

In any case, the outer surface 11 of the undercarriage component 10 is the surface of which the state of wear is to be monitored.

In the undercarriage component 10 a cavity 12 is obtained (better illustrated in FIG. 2) delimited by a side wall 13. The cavity 12 may for example be obtained by boring and have a substantially cylindrical shape (as in the example shown in the appended figures). In other embodiments not illustrated, the shape of the cavity 12 may be a straight prism with a polygonal base, an oblique prism with a polygonal base or a truncated pyramid. The cavity 12 may have a constant radial section along its axial extension or have radial sections with a different area or shape along its axial extension.

In any case, the cavity 12 has an opening 14 facing the outer surface 11 that defines an inlet section for the cavity 12. The cavity 12 has an extension axis A along which the cavity itself extends. The extension axis A crosses the opening 14 and extends in depth towards the inside of the undercarriage component 10 from a first axial end 12a of the cavity 12 to a second axial end 12b opposite the first 12a. In the case of a substantially cylinder shaped cavity (as shown in FIG. 2) the extension axis A coincides with an axis of symmetry for the cavity 12.

Figure 3:
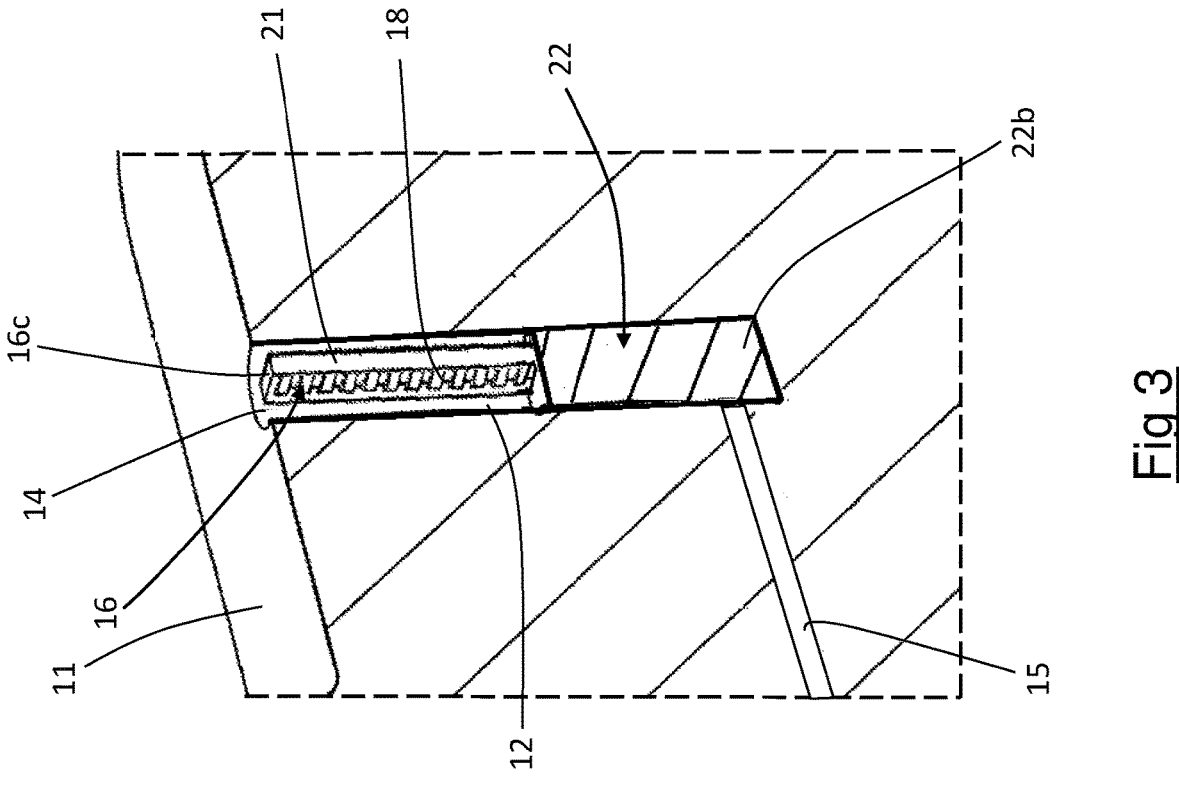
FIGS. 2 and 3 are enlarged views of a detail of the component of FIG. 1 with some parts removed to better highlight others.
Figure 2:
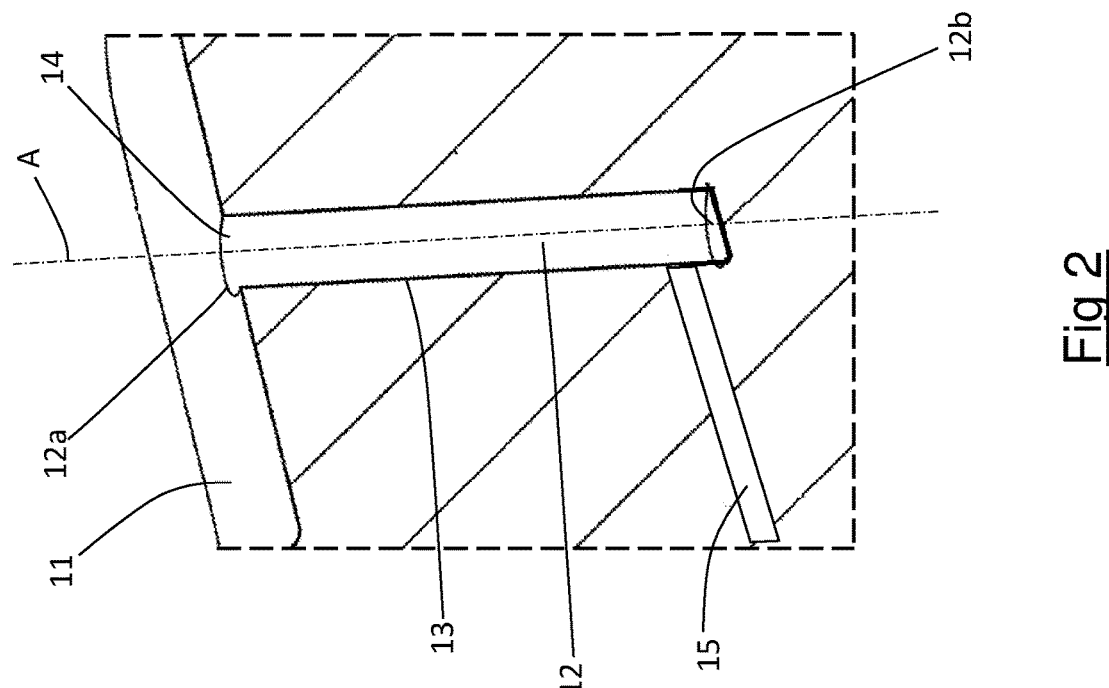

The cavity 12 may be blind and be closed at a second axial end 12b or it may have an opening 12c obtained along the side surface 13 connected to a passage 15 in the undercarriage component 10 (as illustrated schematically in the example of FIGS. 1, 2 and 3). In other embodiments, the cavity 13 may be open at the second axial end 12b (as illustrated in FIG. 6).

The undercarriage component 10 further comprises a wear sensor 16 (better illustrated in FIG. 4) inserted into the cavity 12.

The wear sensor 16 is a flexible printed circuit (FPC) and it comprises an electric circuit 17 comprising a plurality of electrical components 18 each of which having a predetermined measurable electrical characteristic.

The flexible printed circuit is made with photolithography technology or is made by laminating strips of copper about 0.1 millimetres thick between two films of flexible and dielectric polymer materials. The films made of polymer materials are for example made of PET or polyimide. The films made of polymer material are coated with an adhesive that is heat-hardened during the lamination process.

By way of example, a flexible printed circuit according to the present invention having a length of 5 centimetres can be bent in order to make the two opposite ends of the printed circuit overlap without any breaks and without plastic deformations.

The wear sensor 16 is configured to uncouple in sequence the electrical components 18 of the electric circuit 17 following wear of the wear sensor 16.

The electrical components 18 are placed at a measurement portion 16a of the wear sensor 16. A detection portion 16b of the sensor 16 is placed axially below the measurement portion 16a. The detection portion 16b comprises coupling terminals 19 of the electric circuit 17 arranged to be connected to a processing or conditioning device 20 of the electrical signal coming from the wear sensor 16 (schematically illustrated in FIGS. 6 and 7). The device 20 may for example be a transducer that receives an incoming electrical signal from the wear sensor 16 and generates an outgoing signal that varies as the incoming electrical signal varies. The device 20 can be connected to the coupling terminals 19 of the electric circuit 17 through electrical conductors 20a that pass through the passage 15 of the undercarriage component (as schematically illustrated in FIG. 1). In other embodiments (as illustrated for example in FIG. 6), the device 20 can be placed axially below the cavity 12. In other embodiments not illustrated, the device 20 can be housed inside the cavity 13.

The electrical components 18 are, in the preferred embodiment of the invention, resistors connected to one another in parallel and equidistant along the electric circuit 17. As shown schematically in FIG. 3, the electrical components 18 follow one another along an axial direction, so as to be removed in sequence from the electric circuit gradually as the wear of the wear sensor 16 advances. By measuring the electrical resistance at the coupling terminals 19 of the electric circuit 17 it is possible to establish the number of resistors 18 still present on the wear sensor 16 and therefore determine the axial length thereof.

The wear sensor 16 further comprises a substrate 21 (FIGS. 3 and 4) on which the electric circuit 17 is printed or screen printed and on which the components 18 are placed.

The undercarriage component 10 further comprises a support body 22 for the wear sensor 16 placed inside the cavity 12. The support body 22 is positioned inside the cavity 12 so as to face the wear sensor 16 at the opening 14 of the cavity 12.

The support body 22 comprises a first axial end 22a, a second axial end 22b opposite the first one 22a and a central portion 22c that extends between the first 22a and the second axial end 22b.

In an embodiment of the invention, the support body 22 is made, at least on a portion thereof in which the cavity 12 has been obtained, of a material having similar mechanical properties to the mechanical properties of the undercarriage component 10.

By way of example, the undercarriage component 10 can be made of abrasion-resistant steel, e.g. steel with a low carbon content (comprised between 0.2% and 0.45% by mass). The ultimate tensile strength is comprised between about 1450 Mpa and about 1930 MPa. The hardness is comprised between about 420 HWB and 530 HBW 10/3000. An example of steel that can be used is boron steel with an average carbon content of the 37MnB4 or 25MnB5 type.

The support body 22 can be made of the same material as the undercarriage component 10.

In another embodiment, the support body can be made of stainless steel having an ultimate tensile strength between about 650 and about 800 Mpa and a hardness comprised between about 200 and about 270 HBW 10/3000.

In this last embodiment, the ratio between the hardness of the support body 22 and of the undercarriage component 10 is comprised between about 0.38 and about 0.64. The ratio between the ultimate tensile strength of the support body 22 and of the undercarriage component 10 is comprised between about 0.34 and about 0.55.

In a further embodiment, the support body 22 is made of thermoplastic material such as, for example, Ertalon PA6 or PA66 having ultimate tensile strength comprised between 54 MPa and 61 MPa.

In this case, the material of the support body 22 does not have similar mechanical properties to those of the undercarriage component.

The support body 22 comprises a housing seat 23 (FIG. 5) configured to receive the wear sensor 16.

Figure 4:
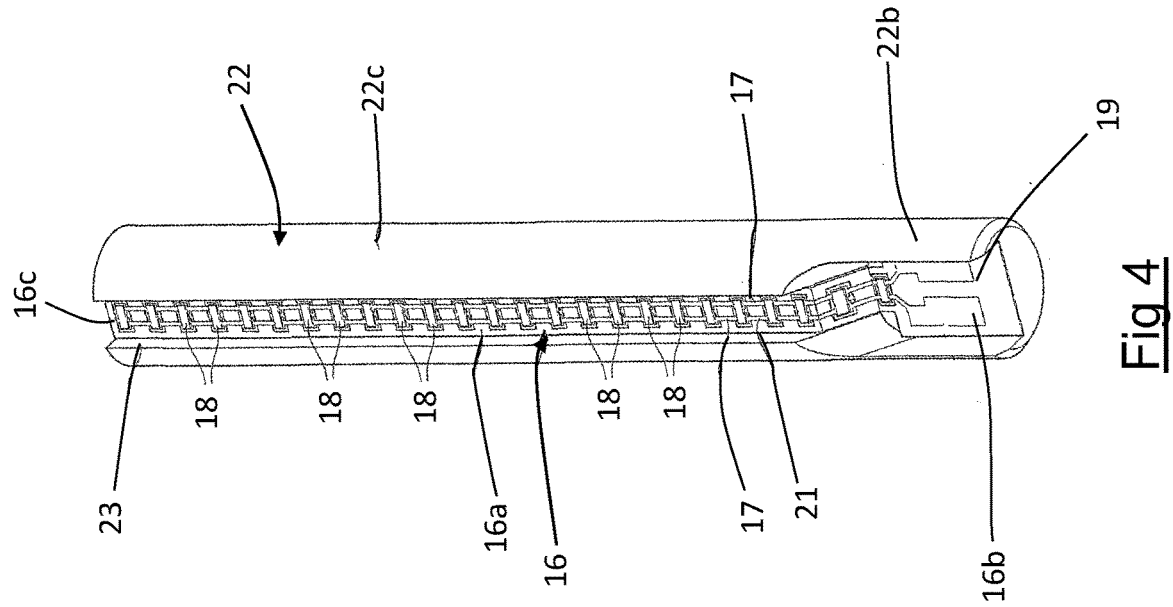

When the wear sensor 16 is inserted into the housing seat 23, a first axial end 16c of the wear sensor 16 is axially aligned with the first axial end 22a of the support body 22, as illustrated in FIG. 4.

The detection portion 16b of the wear sensor 16 is housed in the housing seat 23 at the second axial end 22b of the support body 22.

In the preferred embodiment of the invention, the wear sensor 16 is withheld in the housing seat 23 using adhesive material.

The support body 22 is configured to be inserted into the cavity 12 with radial clearance, although minimum, to enable the adhesive material to form a film that surrounds the support body 22 and that adheres to the side wall 13 of the cavity 12. When the support body 22 is inserted into the cavity 12 with the adhesive active between the support body 22 and the cavity 12, the support body 22 is firmly constrained to the side wall 13 of the cavity 12 and cannot make any movements in the axial direction or in the radial direction with respect to the cavity 12.

In other embodiments, the support body 22 is inserted with mechanical interference into the cavity 12.

When the support body 22 is inserted with mechanical interference into the cavity 12, the support body 22 contacts the side wall 13 of the cavity 12 at least along two contact lines. In other words, the support body 22 has a shape such that any section of the support body along a radial plane has at least two contact points with the side wall 13 of the cavity 12.

Should the degree of mechanical interference not be suitable, the support body 22 can be at least partially coated in adhesive material before being inserted into the cavity 12.

In the preferred embodiment of the invention, the shape of the support body 22 is such for which when the support body 22 is inserted into the cavity 12, the cavity 12 is at least 85% occupied by the support body 22.

The housing seat 23 has dimensions such as to prevent the wear sensor 16, once inserted into the housing seat 23, from exiting the radial dimension of the support body 22, so as to prevent, during the insertion of the support body 22 into the cavity 12, the wear sensor 16 getting damaged.

In other words, when the wear sensor 16 is inserted into the housing seat 23, the side wall 13 of the cavity 12 does not contact the wear sensor 16.

Figure 5:
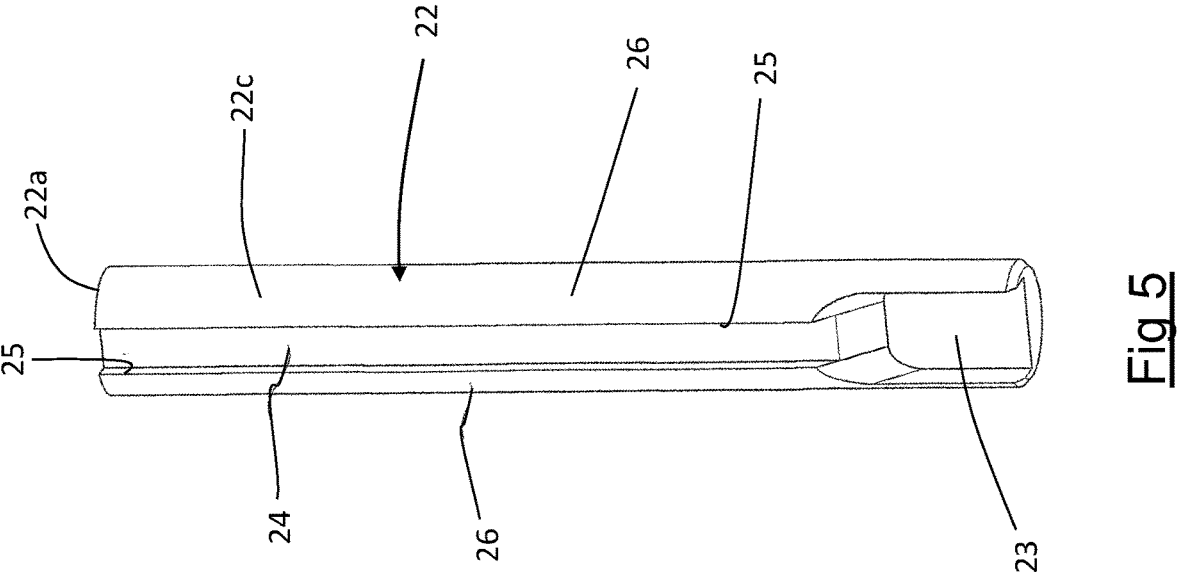
FIGS. 4 and 5 are perspective schematic views of some details of a component according to the present invention.

In the embodiment illustrated in FIG. 5, the housing seat 23 comprises a bottom wall 24 and two side walls 25. The side walls 25 extend radially away from the bottom wall 25 and are joined to a radially external side surface 26 of the support body 22. The bottom wall 25 is radially more internal with respect to the radially external side surface 26 of the support body 22. As shown in FIGS. 4 and 5, the housing seat 23 is open at the radially external side wall 26 of the support body 22.

At the second axial end 22b of the support body 22, the bottom wall 25 of the housing seat is placed radially more internally into the support body to facilitate the positioning of the detection portion 16b of the wear sensor 16.

As illustrated in the example of FIG. 5, the support body has a substantially cylindrical shape dug out by the housing seat 23. When the support body 22 is inserted into the cavity 12, the cavity 12 is completely filled by the support body 22 except for the volume enclosed by the housing seat 23.

In other embodiments of the support body 22, as schematically represented in FIG. 3, the housing seat 23 can be obtained inside the support body 22 and not be open on the radially external side surface 26 of the support body 22. In these embodiments, the support body 22 is preferably made of heat-hardening plastic material directly cast into the inside of the cavity 12 with the wear sensor 16 placed inside the cavity 12. In this case, the support body 22 completely fills the cavity 12.

The present invention has been described with reference to some preferred embodiments thereof. Various modifications can be made to the embodiments described above, still remaining within the scope of protection of the invention, defined by the following claims.

The invention claimed is:

1. A work vehicle component comprising:
a cavity obtained in the work vehicle component, having an extension axis and delimited radially by at least one side wall; an opening for the cavity placed at an outer surface of the work vehicle component, wherein said outer surface is a surface of which a state of wear is to be monitored;
a wear sensor housed in the cavity and comprising a first axial end placed at the opening for the cavity, wherein the first axial end of the wear sensor gets worn as said outer surface of the work vehicle component gets worn;
a support body inserted in the cavity with a first axial end aligned with the first axial end of the wear sensor, wherein the support body is physically connected to the at least one side wall of the cavity and constrained, at least in an axial direction, to the at least one side wall of the cavity, wherein the wear sensor is physically connected to the support body and is constrained, at least in an axial direction, to the support body, wherein a second axial end of the support body opposite the first axial end of the support body terminates inside of the work vehicle component and wherein the support body comprises a housing seat having a bottom wall; and
wherein the housing seat is open at a radially external side surface of the support body, and wherein the bottom wall of the housing seat is placed more radially internal with respect to the radially external side surface.

2. The work vehicle component according to claim 1, wherein the wear sensor comprises a substrate and at least one electric circuit supported by the substrate, wherein the wear sensor comprises a measurement portion that can be worn down and configured to modify measurable electrical properties of the at least one electric circuit according to a degree of wear.

3. The work vehicle component according to claim 2, wherein the support body extends in the axial direction for a length at least equal to the length in the axial direction of the measurement portion of the wear sensor.

4. The work vehicle component according to claim 2, wherein the substrate and the at least one electric circuit of the wear sensor are not in direct contact with the at least one side wall of the cavity.

5. The work vehicle component according to claim 1, wherein the support body has a section, obtained along a predetermined radial plane, having an area of at least 30% of a cross-sectional area of the cavity on a section obtained along the predetermined radial plane.

6. The work vehicle component according to claim 1, wherein a volume of the support body is equal to at least 15% of a volume of the cavity.

7. The work vehicle component according to claim 1, wherein the support body is constrained to the at least one side wall of the cavity with an adhesive.

8. The work vehicle component according claim 1, wherein the support body is made of a metal material.

9. The work vehicle component according to claim 1, wherein the support body is made of a plastic material.

10. The work vehicle component according to claim 1, wherein the support body and the work vehicle component are made of the same material.

11. The work vehicle component according to claim 1, wherein a ratio of a resistance to localised plastic deformations of material constituting the support body and a resistance to localised plastic deformation of material of the work vehicle component surrounding the cavity is equal to or greater than 0.15, where the resistance to localised plastic deformation of material constituting the support body and the resistance to localized plastic deformation of material of the work vehicle component surrounding the cavity are measured with a Brinell scale with identical test conditions and in accordance with ISO 6506-1:2015.

12. The work vehicle component according to claim 1, wherein the wear sensor is a flexible printed circuit (FPC).

13. The work vehicle component according to claim 1, wherein the wear sensor is embedded in the support body.

14. The work vehicle component according claim 1, wherein an ultimate tensile strength of material that constitutes the support body is equal to or greater than 15% of an ultimate tensile strength of the material of the work vehicle component surrounding the cavity, where ultimate tensile strengths of metallic materials of the support body and metallic materials of the work vehicle component surrounding the cavity are measured in accordance with ISO 6892-1:2016 and ultimate tensile strength of plastic or polymeric materials of the support body and plastic or polymeric materials of the work vehicle component surrounding the cavity are measured in accordance with ISO 527-1:2019.

15. The work vehicle component according to claim 1, wherein the support body further comprises an open radially external side.

16. The work vehicle component according to claim 1, wherein the housing further comprises two side walls extending radially away from the bottom wall and are joined to the radially external side surface of the support body.

17. The work vehicle component according to claim 1, wherein a portion of the bottom wall of the housing seat adjacent the second axial end of the support body is located radially more internally within the support body than a remaining portion of the bottom wall of the housing seat.

* * * * *